US008492870B2

(12) United States Patent
Lin et al.

(10) Patent No.: US 8,492,870 B2
(45) Date of Patent: Jul. 23, 2013

(54) SEMICONDUCTOR PACKAGE WITH INTERCONNECT LAYERS

(75) Inventors: Mou-Shiung Lin, Hsinchu (TW); Jin-Yuan Lee, Hsin-Chu (TW); Ching-Cheng Huang, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 0 days.

(21) Appl. No.: 13/159,190

(22) Filed: Jun. 13, 2011

(65) Prior Publication Data

US 2011/0309473 A1    Dec. 22, 2011

Related U.S. Application Data

(60) Continuation of application No. 10/996,537, filed on Nov. 24, 2004, now Pat. No. 7,977,763, which is a continuation of application No. 10/690,350, filed on Oct. 21, 2003, now abandoned, which is a division of application No. 10/054,001, filed on Jan. 19, 2002, now Pat. No. 6,673,698.

(51) Int. Cl.
*H01L 29/00* (2006.01)
*H01L 21/00* (2006.01)
*H05K 7/00* (2006.01)

(52) U.S. Cl.
USPC .... 257/516; 257/700; 257/758; 257/E23.009; 257/E23.019; 438/125; 438/622; 361/820

(58) Field of Classification Search
None
See application file for complete search history.

(56) References Cited

U.S. PATENT DOCUMENTS

| 2,920,232 | A | 1/1960 | Evans |
| 3,504,214 | A | 3/1970 | Lake et al. |
| 3,634,714 | A | 1/1972 | Anderson et al. |
| 3,677,112 | A | 7/1972 | Keniston |
| 3,903,590 | A | 9/1975 | Yokogawa |
| 4,021,838 | A | 5/1977 | Warwick |
| 4,235,498 | A | 11/1980 | Snyder |
| 4,402,888 | A | 9/1983 | Runck |
| 4,622,058 | A | 11/1986 | Leary-Renick et al. |

(Continued)

FOREIGN PATENT DOCUMENTS

| EP | 1094511 A2 | 4/2001 |
| JP | 360004253 | 1/1985 |

(Continued)

OTHER PUBLICATIONS

Lau, John H. et al.: "Chip Scale Package: Design, Materials, Process, Reliability and Applications," Chapter 10.2, Design Concepts and Package Structure, pp. 157-161 (1999).

(Continued)

*Primary Examiner* — Alonzo Chambliss
(74) *Attorney, Agent, or Firm* — Seyfarth Shaw LLP

(57) ABSTRACT

A chip package comprising a glass substrate, wherein a first opening in the glass substrate passes vertically through the glass substrate, a semiconductor chip, a wiring structure comprising a first portion in the first opening and a second portion over the glass substrate, wherein the first portion is connected to the semiconductor chip, wherein the wiring structure comprises a passive device, wherein the wiring structure comprises copper, and a dielectric layer over the glass substrate and on the wiring structure, wherein a second opening in the dielectric layer is over a contact point of the wiring structure, and the contact point is at a bottom of the second opening.

14 Claims, 22 Drawing Sheets

U.S. PATENT DOCUMENTS

| | | | |
|---|---|---|---|
| 4,685,998 A | 8/1987 | Quinn et al. |
| 4,789,647 A | 12/1988 | Peters |
| 4,840,923 A | 6/1989 | Flagello et al. |
| 4,866,501 A | 9/1989 | Shanefield |
| 4,918,811 A | 4/1990 | Eichelberger et al. |
| 5,048,179 A | 9/1991 | Shindo et al. |
| 5,049,980 A | 9/1991 | Saito et al. |
| 5,055,321 A | 10/1991 | Enomoto et al. |
| 5,063,177 A | 11/1991 | Geller et al. |
| 5,073,814 A | 12/1991 | Cole, Jr. et al. |
| 5,081,563 A | 1/1992 | Feng et al. |
| 5,083,187 A | 1/1992 | Lamson et al. |
| 5,095,402 A | 3/1992 | Hernandez et al. |
| 5,099,306 A | 3/1992 | Dunaway et al. |
| 5,111,278 A * | 5/1992 | Eichelberger ............... 257/698 |
| 5,149,662 A | 9/1992 | Eichelberger |
| 5,161,093 A | 11/1992 | Gorczyca et al. |
| 5,188,984 A | 2/1993 | Nishiguchi |
| 5,196,377 A | 3/1993 | Wagner et al. |
| 5,211,278 A | 5/1993 | Mendenhall |
| 5,226,232 A | 7/1993 | Boyd |
| 5,239,198 A | 8/1993 | Lin et al. |
| 5,241,456 A | 8/1993 | Marcinkiewicz et al. |
| 5,250,843 A | 10/1993 | Eichelberger |
| 5,281,151 A | 1/1994 | Arima et al. |
| 5,291,066 A | 3/1994 | Neugebauer et al. |
| 5,300,812 A | 4/1994 | Lupinski et al. |
| 5,324,687 A | 6/1994 | Wojnarowski |
| 5,331,204 A | 7/1994 | Kuroda et al. |
| 5,334,874 A | 8/1994 | Metzler et al. |
| 5,336,928 A | 8/1994 | Neugebauer et al. |
| 5,353,195 A | 10/1994 | Fillion et al. |
| 5,353,498 A | 10/1994 | Fillion et al. |
| 5,359,496 A | 10/1994 | Kornrumpf et al. |
| 5,365,790 A | 11/1994 | Chen et al. |
| 5,366,906 A | 11/1994 | Wojnarowski et al. |
| 5,370,766 A | 12/1994 | Desaigoudar et al. |
| 5,372,967 A | 12/1994 | Sundaram et al. |
| 5,384,488 A | 1/1995 | Golshan et al. |
| 5,388,328 A | 2/1995 | Yokono et al. |
| 5,394,490 A * | 2/1995 | Kato et al. ............... 385/14 |
| 5,401,687 A | 3/1995 | Cole et al. |
| 5,416,356 A | 5/1995 | Staudinger et al. |
| 5,422,513 A | 6/1995 | Marcinkiewicz et al. |
| 5,432,675 A | 7/1995 | Sorimachi et al. |
| 5,432,677 A | 7/1995 | Mowatt et al. |
| 5,434,751 A | 7/1995 | Cole, Jr. et al. |
| 5,450,101 A | 9/1995 | Ishida et al. |
| 5,478,773 A | 12/1995 | Dow et al. |
| 5,483,421 A | 1/1996 | Gedney et al. |
| 5,524,339 A | 6/1996 | Gorowitz et al. |
| 5,532,512 A | 7/1996 | Fillion et al. |
| 5,541,442 A | 7/1996 | Keil et al. |
| 5,548,091 A | 8/1996 | DiStefano et al. |
| 5,548,099 A | 8/1996 | Cole, Jr. et al. |
| 5,565,706 A | 10/1996 | Miura et al. |
| 5,566,441 A | 10/1996 | Marsh et al. |
| 5,576,517 A | 11/1996 | Wojnarowski et al. |
| 5,583,359 A | 12/1996 | Ng et al. |
| 5,602,059 A | 2/1997 | Horiuchi et al. |
| 5,606,198 A | 2/1997 | Ono et al. |
| 5,611,884 A | 3/1997 | Bearinger et al. |
| 5,629,240 A | 5/1997 | Malladi et al. |
| 5,635,762 A | 6/1997 | Gamand |
| 5,648,448 A | 7/1997 | Marrocco, III |
| 5,650,662 A | 7/1997 | Edwards et al. |
| 5,659,201 A | 8/1997 | Wollesen |
| 5,663,106 A | 9/1997 | Karavakis et al. |
| 5,665,989 A | 9/1997 | Dangelo |
| 5,668,399 A | 9/1997 | Cronin et al. |
| 5,691,248 A | 11/1997 | Cronin et al. |
| 5,696,466 A | 12/1997 | Li |
| 5,717,245 A | 2/1998 | Pedder |
| 5,729,053 A | 3/1998 | Orthmann |
| 5,745,984 A | 5/1998 | Cole, Jr. et al. |
| 5,757,072 A | 5/1998 | Gorowitz et al. |
| 5,757,079 A | 5/1998 | McAllister et al. |
| 5,763,108 A | 6/1998 | Chang et al. |
| 5,767,564 A | 6/1998 | Kunimatsu et al. |
| 5,776,796 A | 7/1998 | DiStefano et al. |
| 5,786,239 A | 7/1998 | Ohsawa et al. |
| 5,789,303 A | 8/1998 | Leung et al. |
| 5,792,594 A | 8/1998 | Brown et al. |
| 5,817,541 A | 10/1998 | Averkiou et al. |
| 5,834,339 A | 11/1998 | DiStefano et al. |
| 5,834,832 A | 11/1998 | Kweon et al. |
| 5,834,844 A | 11/1998 | Akagawa et al. |
| 5,841,193 A | 11/1998 | Eichelberger |
| 5,854,001 A | 12/1998 | Casey et al. |
| 5,854,513 A | 12/1998 | Kim |
| 5,872,489 A | 2/1999 | Chang et al. |
| 5,874,770 A | 2/1999 | Saia et al. |
| 5,875,545 A | 3/1999 | DiStefano et al. |
| 5,883,435 A | 3/1999 | Geffken et al. |
| 5,892,273 A | 4/1999 | Iwasaki et al. |
| 5,892,288 A | 4/1999 | Muraki et al. |
| 5,919,548 A | 7/1999 | Barron et al. |
| 5,929,510 A | 7/1999 | Geller et al. |
| 5,932,379 A | 8/1999 | Burm et al. |
| 5,939,214 A | 8/1999 | Mahulikar et al. |
| 5,939,782 A | 8/1999 | Malladi |
| 5,945,741 A | 8/1999 | Ohsawa et al. |
| 5,952,726 A | 9/1999 | Liang |
| 5,959,357 A | 9/1999 | Korman |
| 5,973,908 A | 10/1999 | Saia et al. |
| 5,994,766 A | 11/1999 | Shenoy et al. |
| 6,002,592 A | 12/1999 | Nakamura et al. |
| 6,004,867 A | 12/1999 | Kim, II et al. |
| 6,008,070 A | 12/1999 | Farnworth |
| 6,008,102 A | 12/1999 | Alford et al. |
| 6,010,956 A | 1/2000 | Takiguchi et al. |
| 6,011,314 A | 1/2000 | Leibovitz et al. |
| 6,013,948 A | 1/2000 | Akram et al. |
| 6,018,463 A | 1/2000 | Winslow et al. |
| 6,020,220 A | 2/2000 | Gilleo et al. |
| 6,022,792 A | 2/2000 | Ishii et al. |
| 6,025,995 A | 2/2000 | Marcinkiewicz |
| 6,030,856 A | 2/2000 | DiStefano et al. |
| 6,033,939 A | 3/2000 | Agarwala et al. |
| 6,043,109 A | 3/2000 | Yang et al. |
| 6,045,655 A | 4/2000 | DiStefano et al. |
| 6,046,076 A | 4/2000 | Mitchell et al. |
| 6,077,726 A | 6/2000 | Mistry et al. |
| 6,078,104 A | 6/2000 | Sakurai |
| 6,080,605 A | 6/2000 | DiStefano et al. |
| 6,087,199 A | 7/2000 | Pogge et al. |
| 6,087,648 A | 7/2000 | Zhang et al. |
| 6,093,584 A | 7/2000 | Fjelstad |
| 6,104,091 A | 8/2000 | Ito et al. |
| 6,107,123 A | 8/2000 | DiStefano et al. |
| 6,110,806 A | 8/2000 | Pogge |
| 6,121,688 A | 9/2000 | Akagawa |
| 6,125,039 A | 9/2000 | Suzuki |
| 6,126,428 A | 10/2000 | Mitchell et al. |
| 6,130,116 A | 10/2000 | Smith et al. |
| 6,139,666 A | 10/2000 | Fasano et al. |
| 6,144,100 A | 11/2000 | Shen et al. |
| 6,150,716 A | 11/2000 | MacQuarrie et al. |
| 6,154,366 A | 11/2000 | Ma et al. |
| 6,159,767 A | 12/2000 | Eichelberger |
| 6,163,456 A | 12/2000 | Suzuki et al. |
| 6,168,965 B1 | 1/2001 | Malinovich |
| 6,169,319 B1 | 1/2001 | Malinovich |
| 6,175,161 B1 | 1/2001 | Goetz et al. |
| 6,177,293 B1 | 1/2001 | Netzer |
| 6,180,445 B1 | 1/2001 | Tsai |
| 6,184,143 B1 | 2/2001 | Ohashi et al. |
| 6,187,615 B1 | 2/2001 | Kim et al. |
| 6,187,680 B1 | 2/2001 | Costrini et al. |
| 6,202,299 B1 | 3/2001 | DiStefano et al. |
| 6,204,091 B1 | 3/2001 | Smith et al. |
| 6,205,032 B1 | 3/2001 | Shepherd |
| 6,218,215 B1 | 4/2001 | DiStefano et al. |
| 6,221,687 B1 | 4/2001 | Abramovich |
| 6,225,013 B1 | 5/2001 | Cohen |
| 6,225,692 B1 | 5/2001 | Hinds |
| 6,228,684 B1 | 5/2001 | Maruyama |

| | | | |
|---|---|---|---|
| 6,228,687 B1 | 5/2001 | Akram et al. | |
| 6,229,203 B1 | 5/2001 | Wojnarowski | |
| 6,232,152 B1 | 5/2001 | DiStefano et al. | |
| 6,235,552 B1 | 5/2001 | Kwon et al. | |
| 6,236,098 B1 | 5/2001 | Efland et al. | |
| 6,236,101 B1 | 5/2001 | Erdeljac et al. | |
| 6,239,482 B1 | 5/2001 | Fillion et al. | |
| 6,239,980 B1 | 5/2001 | Fillion et al. | |
| 6,242,282 B1 | 6/2001 | Fillion et al. | |
| 6,242,987 B1 | 6/2001 | Schopf et al. | |
| 6,245,595 B1 | 6/2001 | Nguyen et al. | |
| 6,255,738 B1 | 7/2001 | DiStefano et al. | |
| 6,258,631 B1 | 7/2001 | Ito et al. | |
| 6,271,469 B1 | 8/2001 | Ma et al. | |
| 6,274,391 B1 | 8/2001 | Wachtler et al. | |
| 6,277,669 B1 | 8/2001 | Kung et al. | |
| 6,278,264 B1 | 8/2001 | Burstein et al. | |
| 6,281,583 B1 | 8/2001 | Dirahoui et al. | |
| 6,284,573 B1 | 9/2001 | Farnworth | |
| 6,285,065 B1 | 9/2001 | Levy | |
| 6,287,893 B1 | 9/2001 | Elenius et al. | |
| 6,288,434 B1 | 9/2001 | Levy | |
| 6,288,447 B1 | 9/2001 | Amishiro et al. | |
| 6,288,905 B1 | 9/2001 | Chung | |
| 6,291,884 B1 | 9/2001 | Glenn et al. | |
| 6,294,040 B1 | 9/2001 | Raab et al. | |
| 6,294,741 B1 | 9/2001 | Cole, Jr. et al. | |
| 6,303,423 B1 | 10/2001 | Lin | |
| 6,309,915 B1 | 10/2001 | DiStefano | |
| 6,313,528 B1 | 11/2001 | Solberg | |
| 6,319,827 B1 | 11/2001 | Kowalski et al. | |
| 6,323,096 B1 | 11/2001 | Saia et al. | |
| 6,326,697 B1 | 12/2001 | Farnworth | |
| 6,329,224 B1 | 12/2001 | Nguyen et al. | |
| 6,329,713 B1 | 12/2001 | Farquhar et al. | |
| 6,331,481 B1 | 12/2001 | Stamper et al. | |
| 6,333,557 B1 | 12/2001 | Sullivan | |
| 6,344,401 B1 | 2/2002 | Lam | |
| 6,348,728 B1 | 2/2002 | Aiba et al. | |
| 6,359,320 B1 | 3/2002 | Yamazaki et al. | |
| 6,359,328 B1 | 3/2002 | Dubin | |
| 6,359,335 B1 | 3/2002 | DiStefano et al. | |
| 6,362,087 B1 | 3/2002 | Wang et al. | |
| 6,362,498 B2 | 3/2002 | Abramovich | |
| 6,365,498 B1 | 4/2002 | Chu et al. | |
| 6,373,141 B1 | 4/2002 | DiStefano et al. | |
| 6,383,858 B1 | 5/2002 | Gupta et al. | |
| 6,383,916 B1 | 5/2002 | Lin | |
| 6,384,473 B1 | 5/2002 | Peterson et al. | |
| 6,388,340 B2 | 5/2002 | DiStefano | |
| 6,395,580 B1 | 5/2002 | Tseng | |
| 6,396,148 B1 | 5/2002 | Eichelberger et al. | |
| 6,400,573 B1 | 6/2002 | Mowatt et al. | |
| 6,423,570 B1 | 7/2002 | Ma et al. | |
| 6,424,034 B1 | 7/2002 | Ahn et al. | |
| 6,428,377 B1 | 8/2002 | Choi | |
| 6,429,036 B1 | 8/2002 | Nixon | |
| 6,429,120 B1 | 8/2002 | Ahn et al. | |
| 6,439,728 B1 | 8/2002 | Copeland | |
| 6,440,834 B2 | 8/2002 | Daubenspeck et al. | |
| 6,441,715 B1 | 8/2002 | Johnson | |
| 6,445,064 B1 | 9/2002 | Ishii et al. | |
| 6,458,681 B1 | 10/2002 | DiStefano et al. | |
| 6,459,135 B1 | 10/2002 | Basteres et al. | |
| 6,460,245 B1 | 10/2002 | DiStefano | |
| 6,472,745 B1 | 10/2002 | Iizuka | |
| 6,482,730 B1 | 11/2002 | Masumoto et al. | |
| 6,486,005 B1 | 11/2002 | Kim | |
| 6,486,535 B2 | 11/2002 | Liu | |
| 6,492,723 B2 | 12/2002 | Suyama | |
| 6,492,829 B1 | 12/2002 | Miura et al. | |
| 6,495,914 B1 | 12/2002 | Sekine et al. | |
| 6,496,240 B1 | 12/2002 | Zhang et al. | |
| 6,501,169 B1 | 12/2002 | Aoki et al. | |
| 6,504,227 B1 | 1/2003 | Matsuo et al. | |
| 6,507,102 B2 | 1/2003 | Juskey et al. | |
| 6,521,996 B1 | 2/2003 | Seshan | |
| 6,537,584 B1 | 3/2003 | Zentner et al. | |
| 6,538,210 B2 | 3/2003 | Sugaya et al. | |
| 6,545,354 B1 | 4/2003 | Aoki et al. | |
| 6,546,620 B1 | 4/2003 | Juskey et al. | |
| 6,548,891 B2 | 4/2003 | Mashino | |
| 6,555,469 B1 | 4/2003 | MacIntyre | |
| 6,555,906 B2 * | 4/2003 | Towle et al. | 257/723 |
| 6,555,908 B1 | 4/2003 | Eichelberger et al. | |
| 6,558,976 B2 | 5/2003 | Shrauger | |
| 6,559,528 B2 | 5/2003 | Watase et al. | |
| 6,563,106 B1 | 5/2003 | Bowers et al. | |
| 6,582,991 B1 | 6/2003 | Maeda et al. | |
| 6,590,291 B2 | 7/2003 | Akagawa | |
| 6,602,740 B1 | 8/2003 | Mitchell | |
| 6,603,072 B1 | 8/2003 | Foster et al. | |
| 6,610,621 B2 | 8/2003 | Masuko | |
| 6,610,934 B2 | 8/2003 | Yamaguchi et al. | |
| 6,614,091 B1 | 9/2003 | Downey et al. | |
| 6,614,110 B1 | 9/2003 | Pace | |
| 6,617,174 B2 | 9/2003 | Rotstein | |
| 6,620,513 B2 | 9/2003 | Yuyama et al. | |
| 6,625,028 B1 | 9/2003 | Dove et al. | |
| 6,625,037 B2 | 9/2003 | Nakatani et al. | |
| 6,633,005 B2 | 10/2003 | Ichitsubo et al. | |
| 6,639,299 B2 | 10/2003 | Aoki | |
| 6,639,324 B1 | 10/2003 | Chien | |
| 6,646,347 B2 | 11/2003 | Mercado et al. | |
| 6,653,172 B2 | 11/2003 | DiStefano et al. | |
| 6,653,563 B2 | 11/2003 | Bohr | |
| 6,657,228 B2 | 12/2003 | Ohtani | |
| 6,657,310 B2 | 12/2003 | Lin | |
| 6,673,698 B1 * | 1/2004 | Lin et al. | 438/459 |
| 6,680,544 B2 | 1/2004 | Lu et al. | |
| 6,683,380 B2 | 1/2004 | Efland et al. | |
| 6,686,015 B2 | 2/2004 | Raab | |
| 6,690,845 B1 | 2/2004 | Yoshimura et al. | |
| 6,707,124 B2 | 3/2004 | Wachtler et al. | |
| 6,710,454 B1 | 3/2004 | Boon | |
| 6,713,589 B2 | 3/2004 | Sue et al. | |
| 6,730,857 B2 | 5/2004 | Konrad et al. | |
| 6,734,534 B1 * | 5/2004 | Vu et al. | 257/668 |
| 6,746,898 B2 | 6/2004 | Lin et al. | |
| 6,759,273 B2 | 7/2004 | Felton et al. | |
| 6,765,299 B2 | 7/2004 | Takahashi et al. | |
| 6,780,747 B2 | 8/2004 | DiStefano et al. | |
| 6,780,748 B2 | 8/2004 | Yamaguchi et al. | |
| 6,794,273 B2 | 9/2004 | Saito et al. | |
| 6,794,739 B2 | 9/2004 | Kobayashi et al. | |
| 6,797,544 B2 | 9/2004 | Sakai et al. | |
| 6,800,941 B2 | 10/2004 | Lee et al. | |
| 6,838,750 B2 | 1/2005 | Nuytkens et al. | |
| 6,847,066 B2 | 1/2005 | Tahara et al. | |
| 6,852,616 B2 | 2/2005 | Sahara et al. | |
| 6,861,740 B2 | 3/2005 | Hsu | |
| 6,867,499 B2 | 3/2005 | Tabrizi | |
| 6,885,107 B2 | 4/2005 | Kinsman | |
| 6,914,331 B2 | 7/2005 | Shimoishizaka et al. | |
| 6,933,601 B2 | 8/2005 | Satoh et al. | |
| 6,943,440 B2 | 9/2005 | Kim et al. | |
| 6,963,136 B2 | 11/2005 | Shinozaki et al. | |
| 6,973,709 B2 | 12/2005 | Huang | |
| 6,975,516 B2 | 12/2005 | Asahi et al. | |
| 6,989,600 B2 | 1/2006 | Kubo et al. | |
| 7,067,926 B2 | 6/2006 | Yamazaki et al. | |
| 7,071,024 B2 | 7/2006 | Towle et al. | |
| 7,087,460 B2 | 8/2006 | Lee | |
| 7,115,488 B2 | 10/2006 | Isobe et al. | |
| 7,172,922 B2 | 2/2007 | Benjamin | |
| 7,220,667 B2 | 5/2007 | Yamagata | |
| 7,239,028 B2 | 7/2007 | Anzai | |
| 7,271,033 B2 | 9/2007 | Lin et al. | |
| 7,272,888 B2 | 9/2007 | DiStefano | |
| 7,294,905 B2 | 11/2007 | Ogino et al. | |
| 7,297,614 B2 | 11/2007 | Lee et al. | |
| 7,342,258 B2 | 3/2008 | Yamazaki et al. | |
| 7,345,365 B2 | 3/2008 | Lee et al. | |
| 7,365,273 B2 | 4/2008 | Fairchild et al. | |
| 7,397,117 B2 | 7/2008 | Lin et al. | |
| 7,413,929 B2 | 8/2008 | Lee et al. | |
| 7,417,865 B2 | 8/2008 | Kim | |
| 7,449,412 B2 | 11/2008 | Nuytkens et al. | |

| | | |
|---|---|---|
| 7,454,834 B2 | 11/2008 | DiStefano |
| 7,470,865 B2 | 12/2008 | Fushie et al. |
| 7,511,376 B2 | 3/2009 | Lin et al. |
| 7,545,044 B2 | 6/2009 | Shibayama et al. |
| 7,653,371 B2 | 1/2010 | Floyd |
| 7,657,242 B2 | 2/2010 | Floyd |
| 7,678,695 B2 | 3/2010 | Taniguchi et al. |
| 7,786,002 B2 | 8/2010 | Leib et al. |
| 7,787,130 B2 | 8/2010 | Webster |
| 7,830,588 B2 | 11/2010 | Miles |
| 7,839,356 B2 | 11/2010 | Hagood et al. |
| 7,848,004 B2 | 12/2010 | Miles |
| 7,863,524 B2 | 1/2011 | Shioga et al. |
| 7,881,686 B2 | 2/2011 | Floyd |
| 7,898,058 B2 | 3/2011 | Lin et al. |
| 7,977,763 B2 * | 7/2011 | Lin et al. ................ 257/516 |
| 8,022,551 B2 | 9/2011 | Soga et al. |
| 8,119,446 B2 | 2/2012 | Lin et al. |
| 2001/0013653 A1 | 8/2001 | Shoji |
| 2001/0021541 A1 | 9/2001 | Akram et al. |
| 2001/0026010 A1 | 10/2001 | Horiuchi et al. |
| 2001/0026435 A1 * | 10/2001 | Sakai ................ 361/306.3 |
| 2001/0028098 A1 | 10/2001 | Liou |
| 2001/0031514 A1 | 10/2001 | Smith |
| 2001/0033021 A1 | 10/2001 | Shimoishizaka et al. |
| 2001/0033474 A1 | 10/2001 | Sakai et al. |
| 2001/0037863 A1 | 11/2001 | Carson et al. |
| 2001/0042901 A1 | 11/2001 | Maruyama |
| 2001/0051426 A1 | 12/2001 | Pozder et al. |
| 2002/0001966 A1 | 1/2002 | Ito et al. |
| 2002/0004288 A1 | 1/2002 | Nishiyama |
| 2002/0006718 A1 | 1/2002 | DiStefano |
| 2002/0007904 A1 | 1/2002 | Raab et al. |
| 2002/0020898 A1 | 2/2002 | Vu et al. |
| 2002/0030273 A1 | 3/2002 | Iwamoto et al. |
| 2002/0063304 A1 | 5/2002 | Toeda et al. |
| 2002/0070443 A1 | 6/2002 | Mu et al. |
| 2002/0074641 A1 | 6/2002 | Towle et al. |
| 2002/0079575 A1 | 6/2002 | Hozoji et al. |
| 2002/0084510 A1 | 7/2002 | Jun et al. |
| 2002/0094671 A1 | 7/2002 | Distefano et al. |
| 2002/0121689 A1 | 9/2002 | Honda |
| 2002/0127771 A1 | 9/2002 | Akram et al. |
| 2002/0133943 A1 | 9/2002 | Sakamoto et al. |
| 2002/0135063 A1 | 9/2002 | Alcoe et al. |
| 2002/0137263 A1 | 9/2002 | Towle et al. |
| 2002/0142521 A1 | 10/2002 | Steffens |
| 2002/0158334 A1 | 10/2002 | Vu et al. |
| 2002/0159242 A1 | 10/2002 | Nakatani et al. |
| 2002/0168797 A1 | 11/2002 | DiStefano et al. |
| 2002/0180041 A1 | 12/2002 | Sahara et al. |
| 2002/0184758 A1 | 12/2002 | DiStefano |
| 2003/0020180 A1 | 1/2003 | Ahn et al. |
| 2003/0027373 A1 | 2/2003 | DiStefano et al. |
| 2003/0038331 A1 | 2/2003 | Aoki et al. |
| 2003/0080437 A1 | 5/2003 | Gonzalez et al. |
| 2003/0118738 A1 | 6/2003 | Shuy et al. |
| 2003/0122246 A1 | 7/2003 | Lin et al. |
| 2003/0134455 A1 | 7/2003 | Cheng et al. |
| 2003/0201534 A1 | 10/2003 | Eichelberger et al. |
| 2003/0201548 A1 | 10/2003 | Ikezawa et al. |
| 2003/0205804 A1 | 11/2003 | Lee et al. |
| 2003/0218246 A1 | 11/2003 | Abe et al. |
| 2003/0224613 A1 | 12/2003 | Ramanathan et al. |
| 2004/0009629 A1 | 1/2004 | Ahn et al. |
| 2004/0023450 A1 | 2/2004 | Katagiri et al. |
| 2004/0063249 A1 | 4/2004 | Lin et al. |
| 2004/0084741 A1 | 5/2004 | Boon |
| 2004/0094841 A1 | 5/2004 | Matsuzaki et al. |
| 2004/0113245 A1 | 6/2004 | Takaoka et al. |
| 2004/0125579 A1 | 7/2004 | Konishi et al. |
| 2004/0140556 A1 | 7/2004 | Lin et al. |
| 2004/0140559 A1 | 7/2004 | Goller et al. |
| 2004/0168825 A1 | 9/2004 | Sakamoto et al. |
| 2005/0070085 A1 | 3/2005 | Huang et al. |
| 2005/0184358 A1 | 8/2005 | Lin |
| 2005/0208757 A1 | 9/2005 | Lin |
| 2005/0218515 A1 | 10/2005 | Kweon et al. |
| 2006/0001152 A1 | 1/2006 | Hu |
| 2006/0225272 A1 | 10/2006 | DiStefano |
| 2006/0228272 A1 | 10/2006 | Watson et al. |
| 2006/0244137 A1 | 11/2006 | Kikuchi et al. |
| 2011/0205720 A1 | 8/2011 | Lee et al. |

FOREIGN PATENT DOCUMENTS

| | | |
|---|---|---|
| JP | 5114665 | 5/1993 |
| JP | 09260581 | 10/1997 |
| JP | 2000003985 A | 1/2000 |
| TW | 241438 | 2/1995 |
| TW | 385509 B | 3/2000 |
| TW | 403980 B | 9/2000 |
| TW | 417265 B | 1/2001 |
| TW | 423127 B | 2/2001 |
| TW | 423132 B | 2/2001 |
| TW | 444370 B | 7/2001 |
| TW | 449894 B | 8/2001 |
| TW | 452930 B | 9/2001 |
| TW | 454318 B | 9/2001 |
| TW | 456006 B | 9/2001 |
| TW | 457662 B | 10/2001 |
| TW | 457830 B | 10/2001 |
| TW | 463274 B | 11/2001 |
| TW | 466652 B | 12/2001 |
| TW | 466725 B | 12/2001 |
| TW | 469549 B | 12/2001 |
| TW | 531854 | 5/2003 |
| TW | 90123655 | 5/2003 |

OTHER PUBLICATIONS

Millman, Jacob: "Microelectronics Second Edition, McGraw Hill series in Electrical and Computer Engineering: Digital and Analog Circuits and Systems," pp. 115 and 167 (1987).

Tummala, Rao E. et al.: "Microelectronics Packaging Handbook, Technology Drivers, Part I," Second Edition, An Overview and Chapter 8.2 Chip-Level Interconnection Evolution, pp. I-12, I-13, I-64, I-82, I-85 to I-87 and II-133 (1997).

ROC Cancellation Case No. 090131210N01 Third Supplemental Cancellation Brief filed by ACE on May 13, 2010, with English Translated Summary.

"Electronic Materials Handbook, vol. 1—Packaging: Other Design Considerations; Materials and Electronic Phenomena; Physical Characteristics of Microelectronic Materials" ASM International Handbook Committee, pp. 104-111, ASM International (1989).

Kuo, "Semiconductor Packaging Engineering", Zhan Yi-Zheng Publisher, Registration Taipei, Apr. 2000, Table 9.1.

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC ® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Lau, John H., et al., "Chip Scale Package—Design Materials Process Reliability and Applications", Chapter 30 "EPIC's Chip Scale Package," pp. 467-475, McGraw-Hill Professional, 1999.

Emery, et al. "Novel Microelectronic Packaging Method for Reduced Thermomechanical Stresses on Low Dielectric Constant Materials" Intel Corp., Chandler, AZ.

Lau, John H. et al., "Chip Scale Package, General Electric's Chip-On-Flex Chip Scale Package (COF-CSP)", Feb. 28, 1999, P0156-161, Chapter ten, McGraw-Hill Professional.

Millman, Jacob; "Digital and Analog Circuits and Systems", Micro Electronic, Mar. 1979, pp. 115 & 167, Sec 4-11 & Sec 6-1, McGraw-Hill College.

Semiconductor packaging process, Chapter 9, Microstructures and properties of materials, p. 9-5 (1999).

Tummala, et al. "Microelectronic Packaging Handbook," Chapter 9, Van Nostrand Reinhold, NY, 1989, pp. 673-725.

* cited by examiner

SEMICONDUCTOR PACKAGE WITH INTERCONNECT LAYERS

This application is a continuation of U.S. application Ser. No. 10/996,537, filed on Nov. 24, 2004, now U.S. Pat. No. 7,977,763, which is a continuation of U.S. application Ser. No. 10/690,350, filed on Oct. 21, 2003, now abandoned, which is a division of U.S. application Ser. No. 10/054,001, filed on Jan. 19, 2002, now U.S. Pat. No. 6,673,698, all of which are herein incorporated by reference in their entirety.

BACKGROUND OF INVENTION (1) Technical Field

This invention relates in general to the interconnection and packaging of semiconductor dies and discrete components.

(2) Description of Prior Art

The following publications relate to the use of thin films in the interconnection and packaging of semiconductor dies.
Microelectronic Packaging Handbook Chapter 9. R. R. Tummala, E. J. Rymaszewski. Van Nostrand Reinhold 1989.
Novel Microelectronic Packaging Method For Reduced Thermomechanical Stresses on Low Dielectric Constant Materials R. M. Emery, S. Towle, H. Braunisch, C. Hu, G. Raiser, G. J. Vandentop. Intel Corp. Chandler, Ariz.

The requirements for packaging of semiconductor circuit devices are that the package provides physical protection, thermal control, powering capability, and desirable electrical properties of the interconnections. Semiconductor packages also provide the physical translation of interconnecting wiring structures from the fine wiring and wire spacing, and small area, of the semiconductor chip to the bigger interconnection spacing and larger area of the next level of assembly. This capability is usually referred to as "fan-out". In addition the packages need to provide the ability to integrate passive components, such as capacitors, inductors, resistors, waveguides, filters, MEMS (MicroElectroMechanical) devices, and the like, into the wiring structure.

These demands have been and are currently met by numerous package designs. In general these designs tend to degrade the signals that communicate between devices. Usually this degradation is due to the high dielectric constant materials and high resistance metal used as insulators in the interconnection design. The materials used as insulators; silicon oxides, glass, glass ceramics, or ceramics are chosen for their mechanical properties and the method of fabrication. An important mechanical property is the material's thermal coefficient of expansion, or TCE. The TCE in many package designs needs to match that of the silicon semiconductor die in order to have low mechanical stresses in the package structure.

Materials with low TCE also have high dielectric constants (k). The high dielectric constants result in unwanted electrical properties of the interconnections; i.e., high impedances. Examples of such designs are semiconductor packages that utilize ceramic substrates to mount and interconnect the semiconductor circuits.

In order to take advantage of the high switching speeds of today's digital circuits the interconnection technology both on and off the semiconductor chips or dies requires novel approaches utilizing low dielectric constant (k) materials such as polyimide or BCB (benzocyclobutene) to provide the necessary electrical parameters of the interconnects that do not degrade circuit performance.

The use of low dielectric materials used as insulating layers for interconnects also requires novel mechanical design approaches to minimize the deleterious effects of TCE mismatches.

SUMMARY OF THE INVENTION

The objective of the present invention is to provide a semiconductor interconnecting package design and method of fabrication utilizing polymer thin film techniques.

It is a further objective of the invention that the semiconductor package provide the interconnect density required by the semiconductor design.

It is also the objective of the present invention to provide a semiconductor package that allows for input and output interconnections on a pitch compatible both with the semiconductor and the next level of package.

The capability to place discrete components close to the semiconductor circuit's input and output connections is an additional objective of the present invention.

In addition an objective of the present invention is to utilize current fabrication techniques and existing fabrication infrastructure.

The above objectives are achieved by the present invention by utilizing a glass or glass-metal composite substrate as the basic structure of the package. Semiconductor dies are bonded to the substrates and a thin film structure is fabricated utilizing metal and polymer films to interconnect the semiconductor dies. The glass or glass-metal composite substrate provides the necessary mechanical protection and support to the semiconductor dies. It also provides the planarity necessary for the fabrication of the interconnect polymer layers that interconnect the semiconductors.

DETAILED DESCRIPTION OF THE PREFERRED EMBODIMENT

Figure 1A:
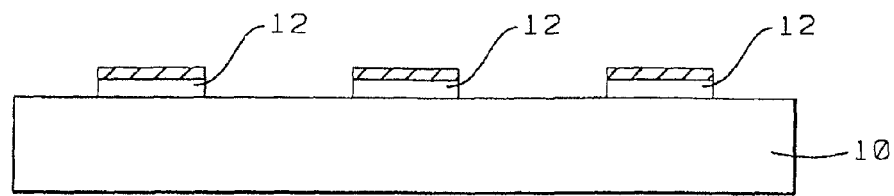
FIGS. 1a-1j show a first embodiment of the invention and the major fabrication steps.
Figure 1B:
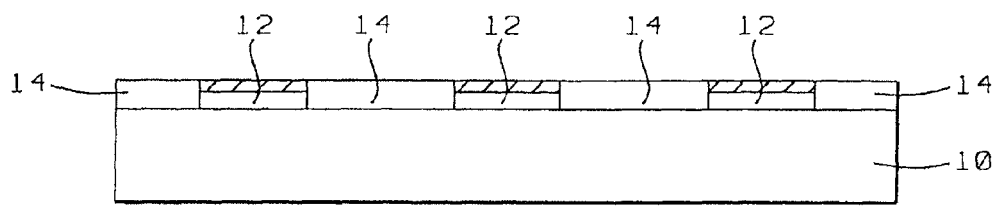
Figure 1C:
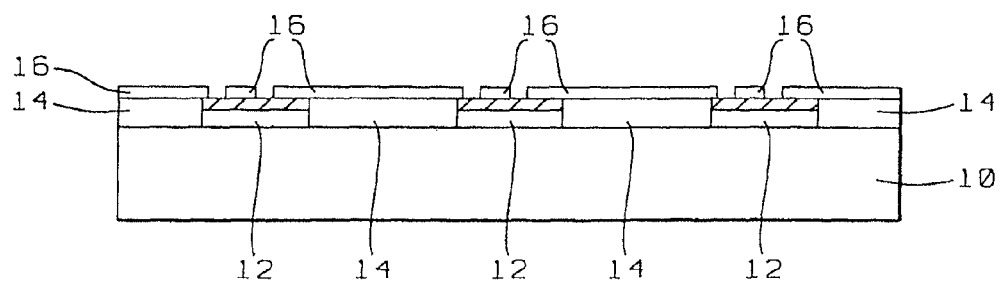
Figure 1D:
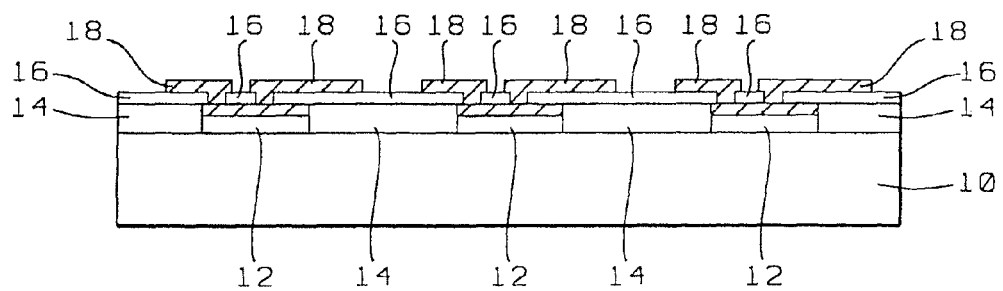
Figure 1E:
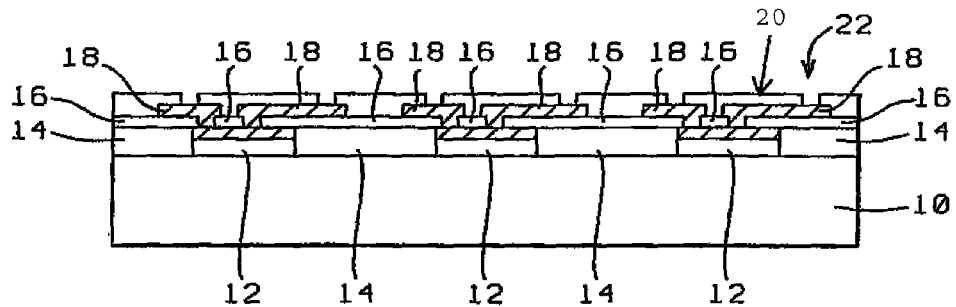
Figure 1F:
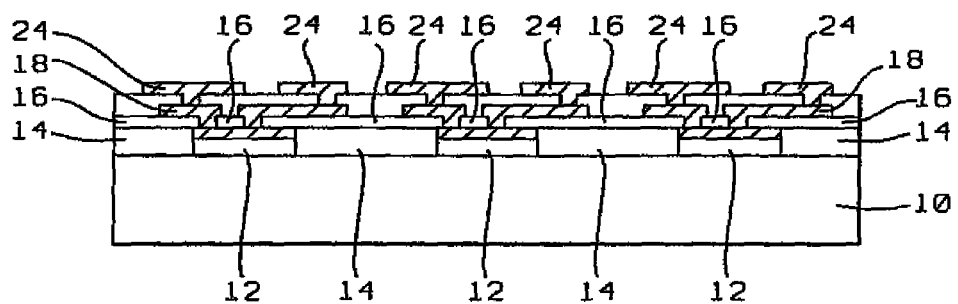
Figure 1G:
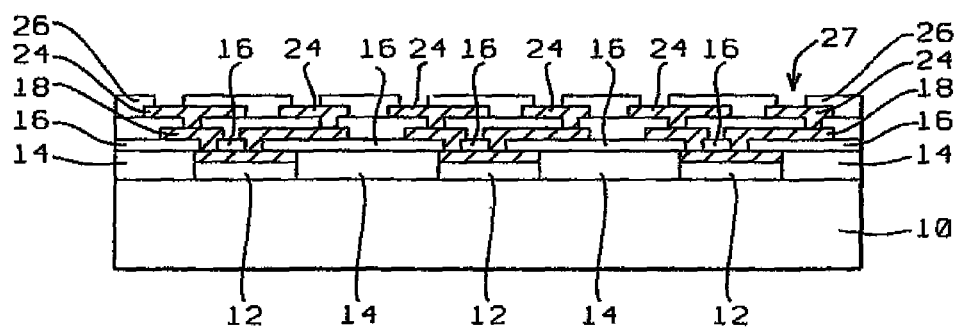
Figure 1H:
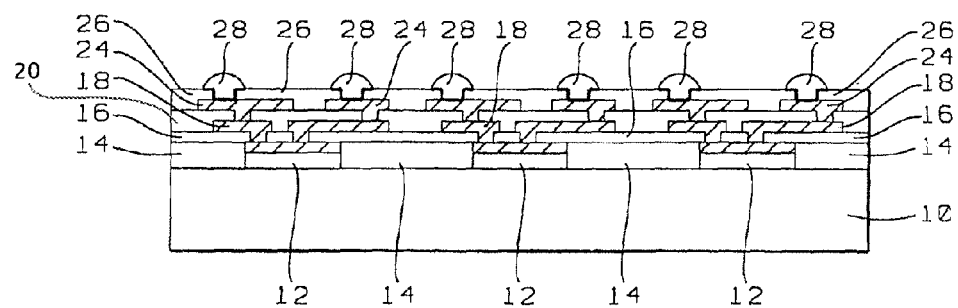

Semiconductor packages provide mechanical protection to the semiconductor dies as well as providing the ability to interconnect the circuits and the circuits to the next level of package. The semiconductor packages also provide the necessary interconnection paths between semiconductor dies when used in multi-chip designs.

One approach to providing interconnection capabilities and connectivity to the next level package, is described in U.S. patent application Ser. No. 09/251,183; filed on Feb. 17, 1999, and herein incorporated by reference. After typical semiconductor processing is completed, including a top passivation layer and exposed metal pads, this application describes a "post passivation process" using thick layers of organic dielectric films, and thick metal layers for signal paths and power/ground busses. Post passivation technology offers low impedance interconnection, passive components and metal bumps (usually solder) based on a wafer level process. However, the wafer level process limits the capability of fan out of pad location to a larger pitch, and limits the capability to integrate more passive components requiring a large area. The invention relies on a separate substrate for the pad fan out and accommodation of more and bigger passive components.

The interconnect technology used needs the ability to provide the necessary fine pitch as required by the semiconductor circuits. Also, the interconnect technology has to provide low impedance interconnects utilizing low dielectric constant (k) insulating layers. The present invention discloses five different embodiments for the thin film semiconductor package structure.

The first embodiment of the present invention as shown in FIGS. 1a-1j utilizes a glass substrate 10. Semiconductor dies 12 are attached by conventional means: i.e., die bonding to the glass substrates face up, at the desired locations. A polymer 14 is optionally used to fill the gaps between the dies and provide a planar surface. This material may also be epoxy, deposited by spin-on, dispense, or screen printing. The first layer of dielectric 16, a polymer such as polyimide, BCB, elastomer and the like, is deposited by spin coating to a thickness of between about 5 and 100 um. If the polymer or epoxy 14 is not used to fill the gaps between dies, the dielectric 16 is used to fill the gaps. Contact holes to the semiconductor dies are exposed by lithographic and etching techniques to expose the metal contacts on the semiconductor dies. The polymer 16 can be photosensitive material.

The first metal layer 18 is deposited by sputtering or electroplating and is patterned by photolithographic techniques. This layer contains the interconnects or fan-out lines and may contain passive components such as capacitors, inductors, resistors, waveguides, filters, MEMS devices, and the like, that are required by the electrical design. The metal used is preferably copper but may be gold, aluminum or other conducting elements, and is deposited to a thickness of between about 1 and 150 um.

The second layer of dielectric polymer 20 is formed by spin-on coating, screen printing or laminating, to a thickness of between about 1 and 150 um, and patterned by photolithographic techniques. Chemical etching is used to open contact holes 22 to the first layer of metal 18. The polymer 20 can also be photosensitive material.

A second layer of metal 24 is then deposited, to a similar thickness as metal layer 18, by sputtering or electroplating to provide the necessary interconnects or fan-out to the terminals of the package or a third layer of metal if required.

Multiple alternating layers of dielectric and metal (not shown) may be deposited and patterned until the final layer of dielectric 26 is then deposited, on the last layer of metal 24, and holes opened to the contact points of metal layer 24.

A layer of solder is deposited by electroplating, screen printing or ball mounting and contacts are made through the etched holes in the insulating layer to the final metal layer. The solder is then reflowed to form the solder bumps 28. Alternately, gold bumps, or pins may be used, as is known in the art.

Figure 1I:
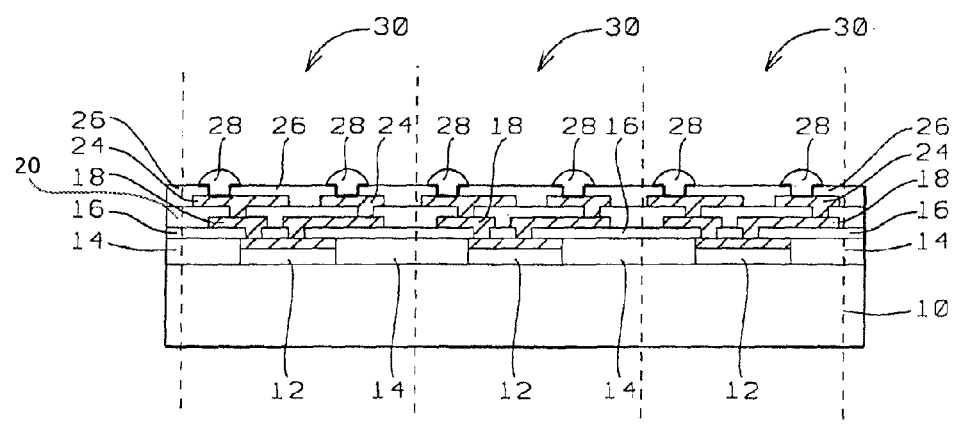
Figure 1J:
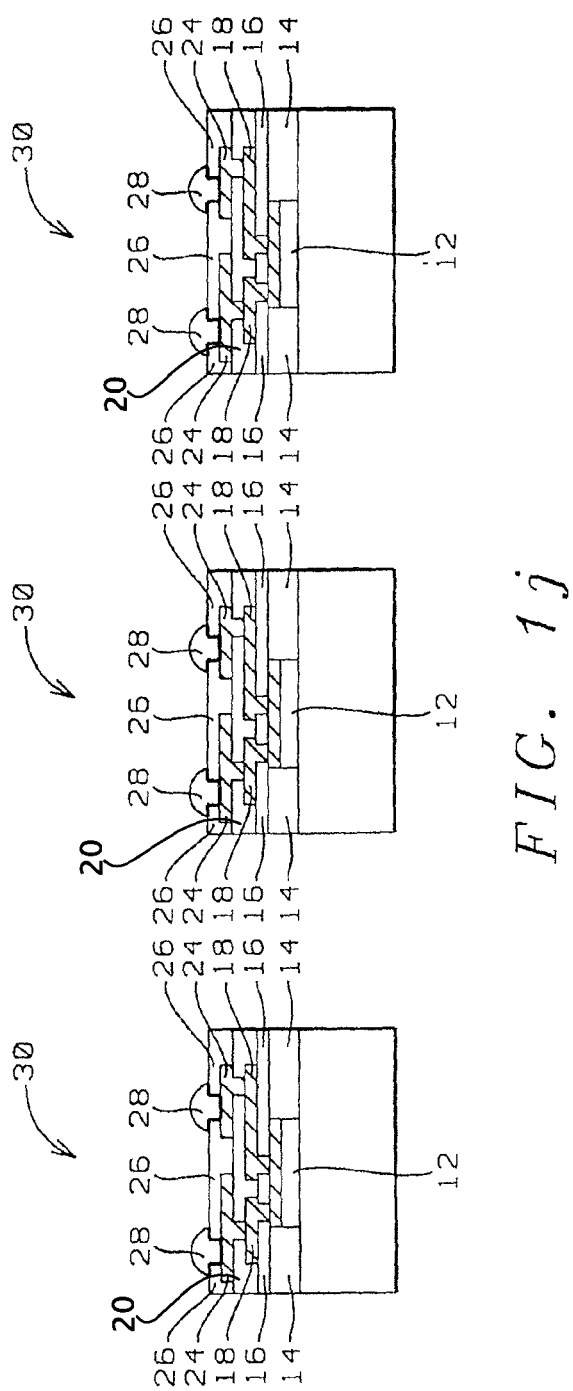
Figure 2A:
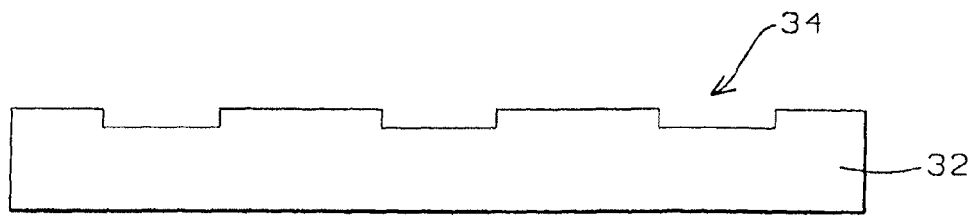
FIGS. 2a-2j show a second embodiment of the invention and the major fabrication steps.
Figure 2B:
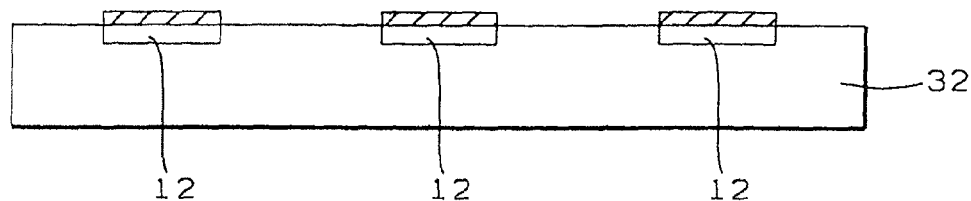
Figure 2C:
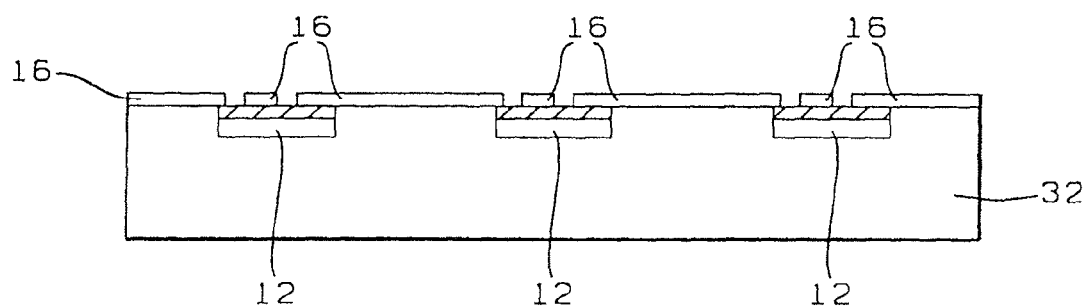
Figure 2D:
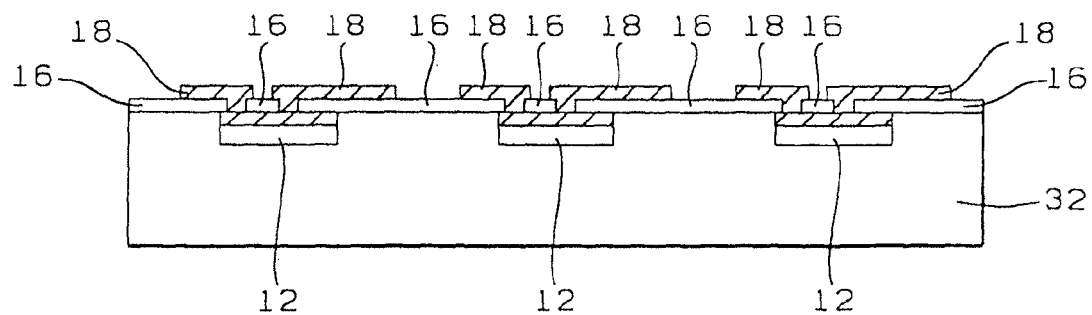
Figure 2E:
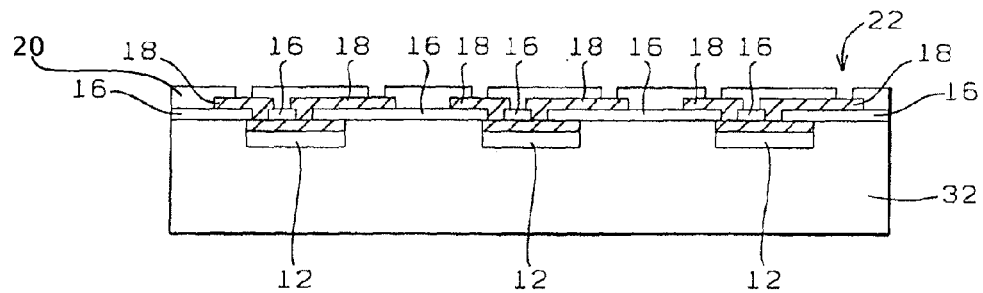
Figure 2F:
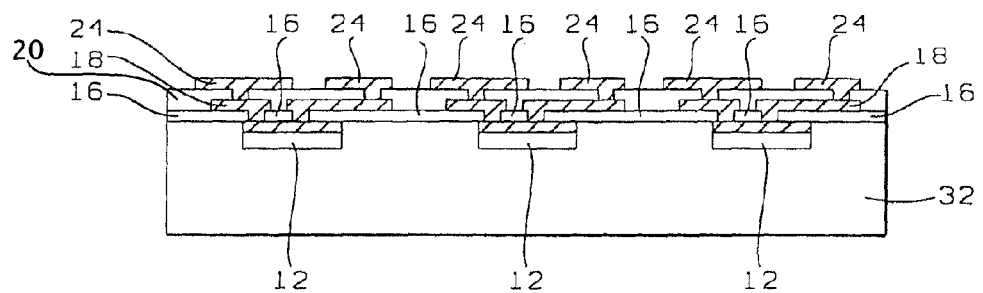
Figure 2G:
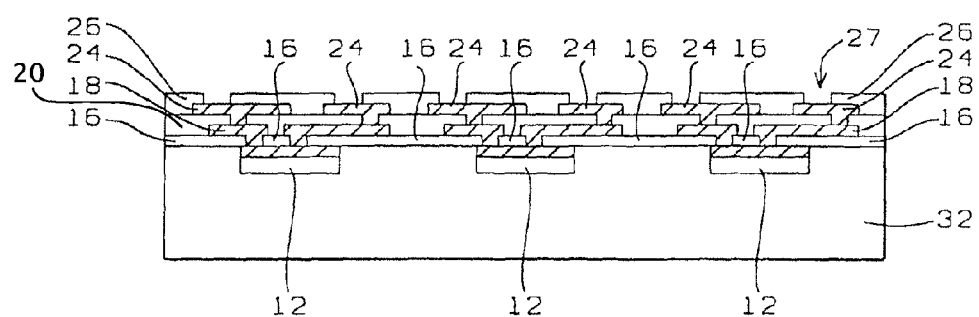
Figure 2H:
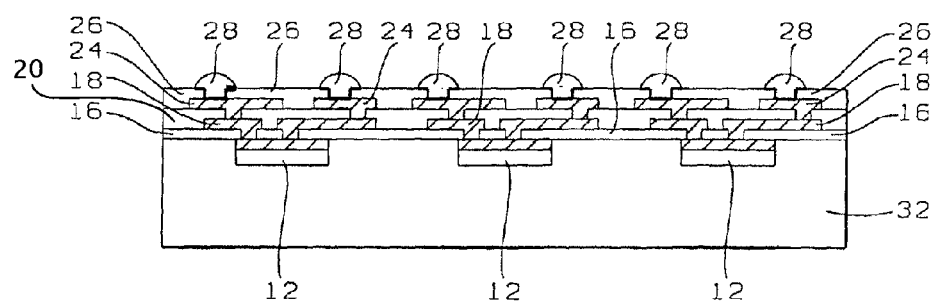
Figure 2I:
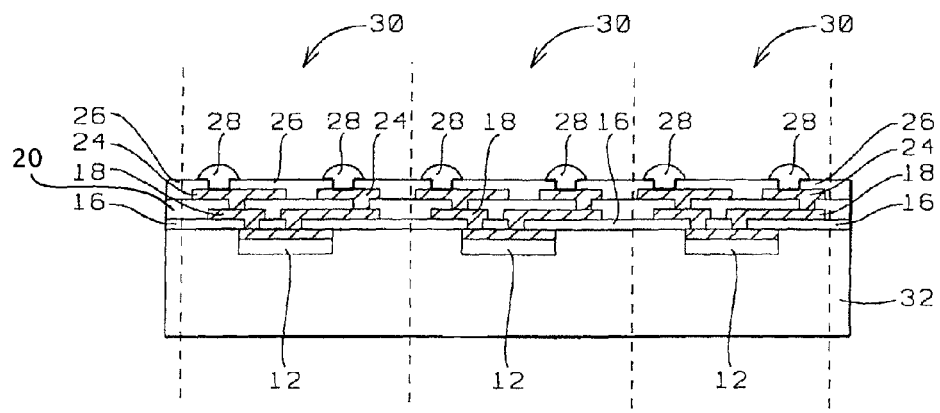
Figure 2J:
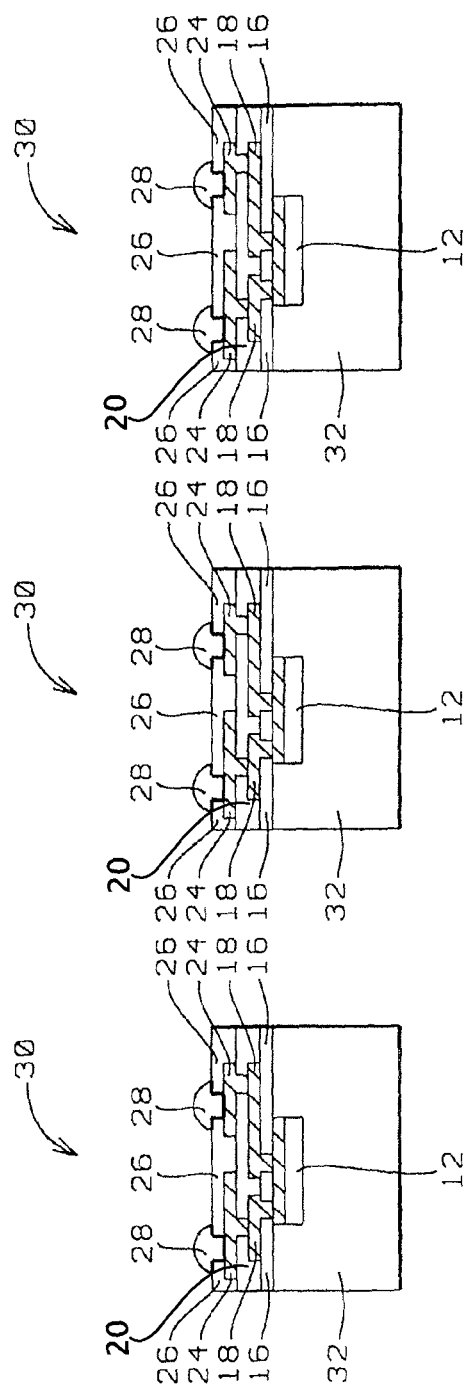
Figure 3A:
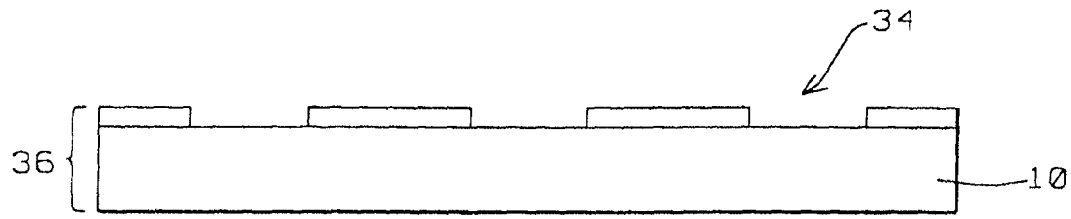
FIGS. 3a-3j show a third embodiment of the invention and the major fabrication steps.
Figure 3B:
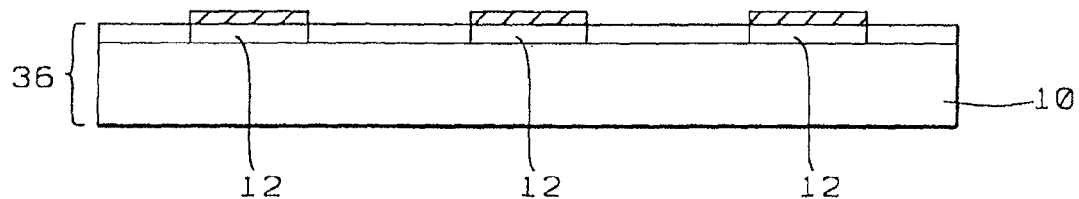
Figure 3C:
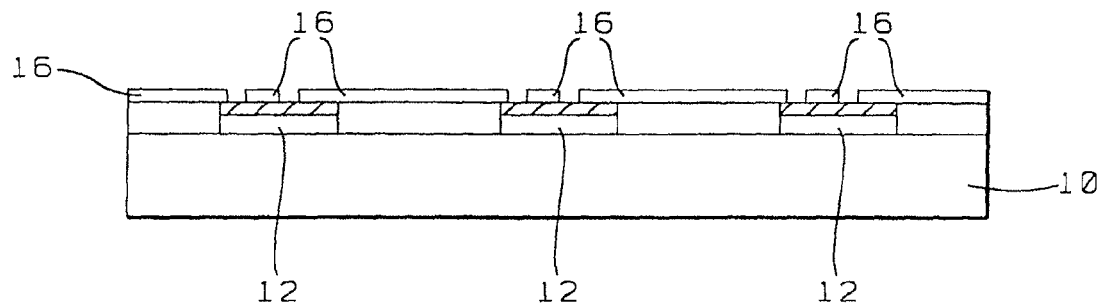
Figure 3D:
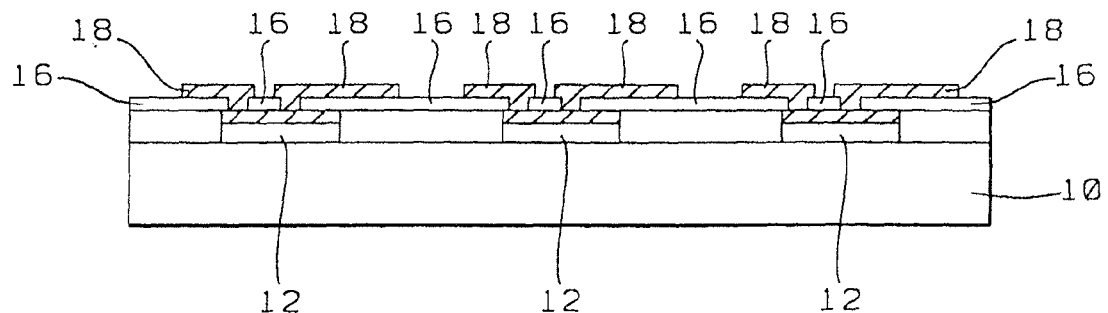
Figure 3E:
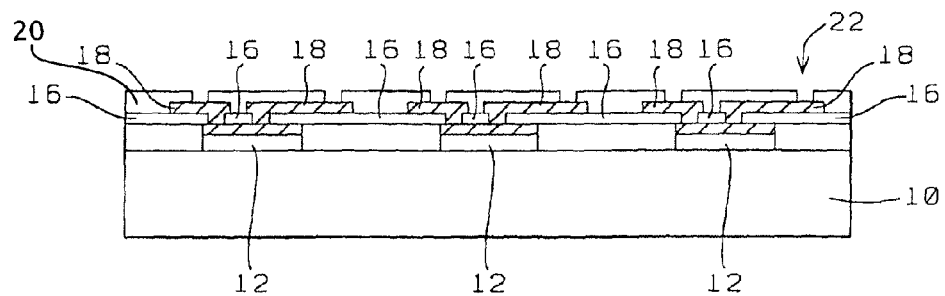
Figure 3F:
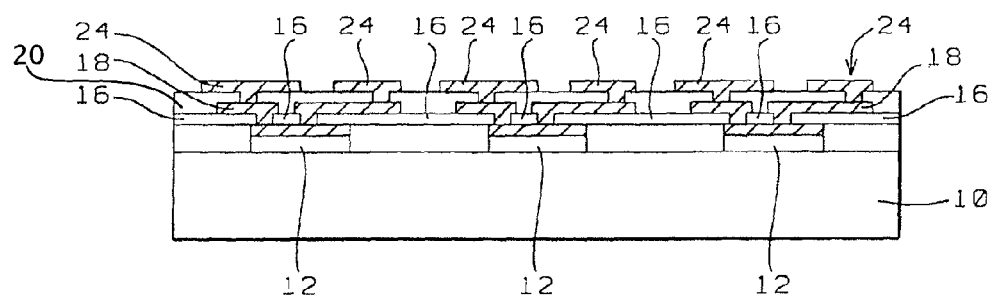
Figure 3G:
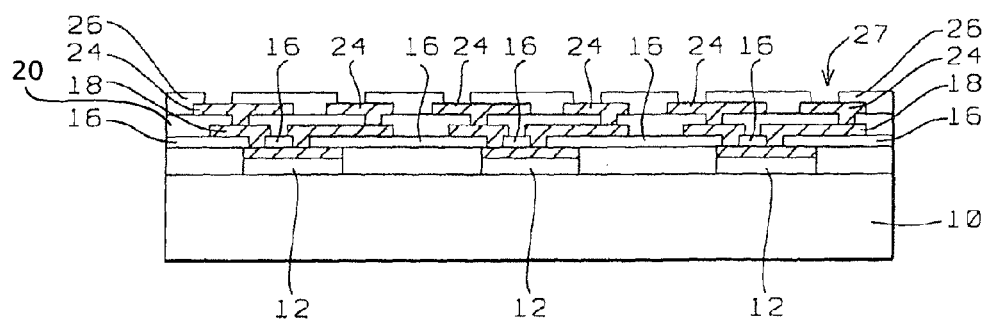
Figure 3H:
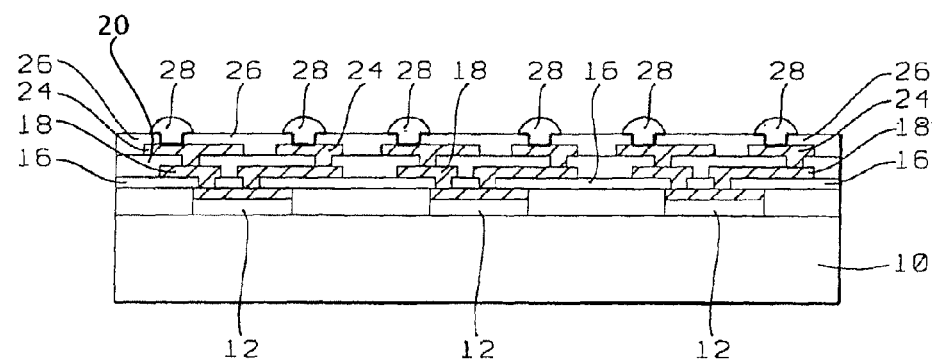
Figure 3I:
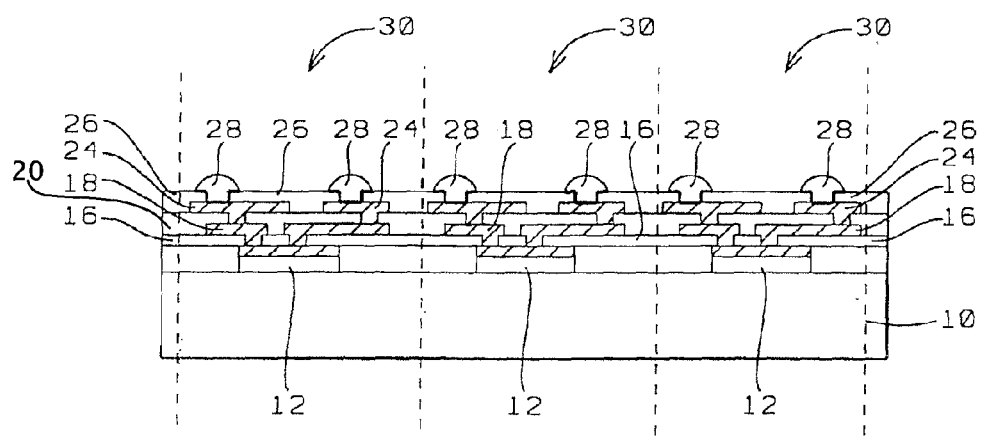
Figure 3J:
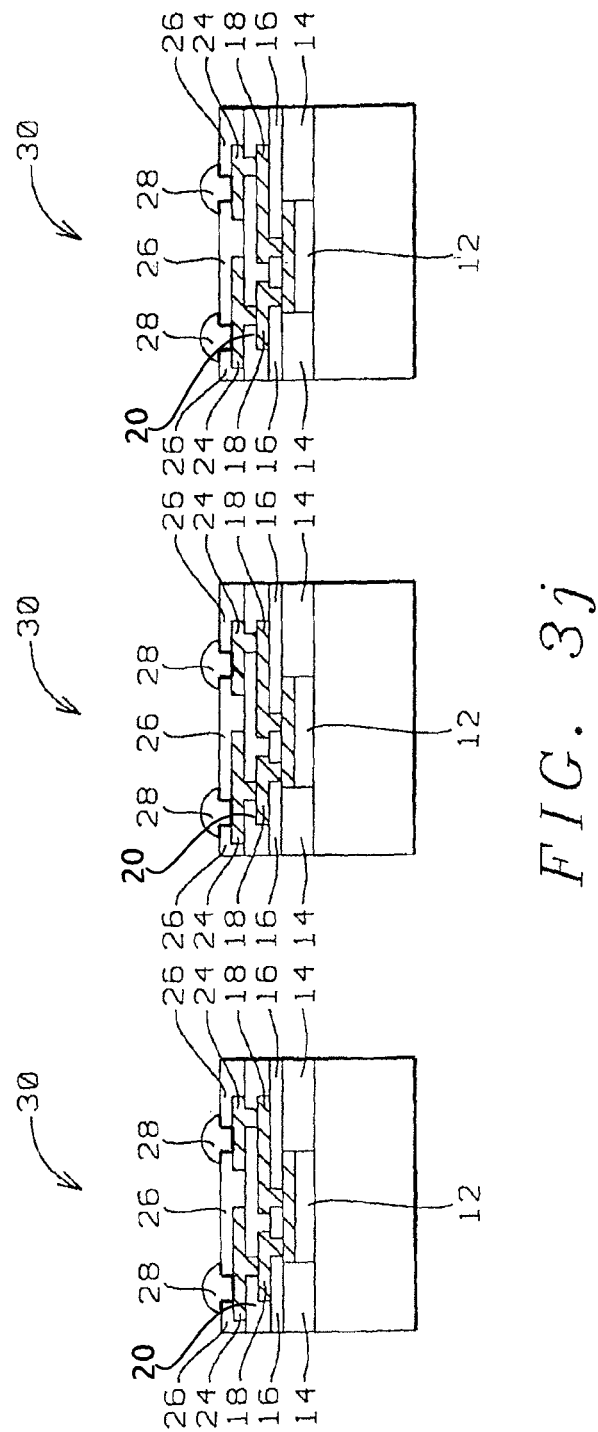
Figure 4A:
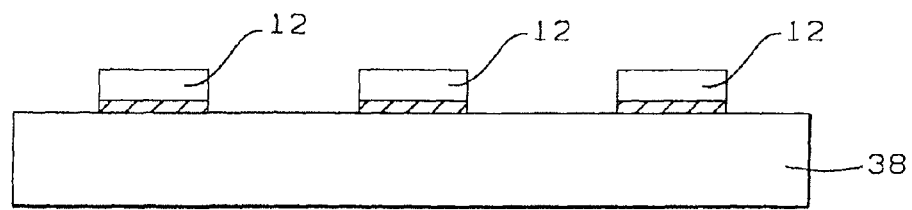
FIGS. 4a-4l show a fourth embodiment of the invention and the major fabrication steps.
Figure 4B:
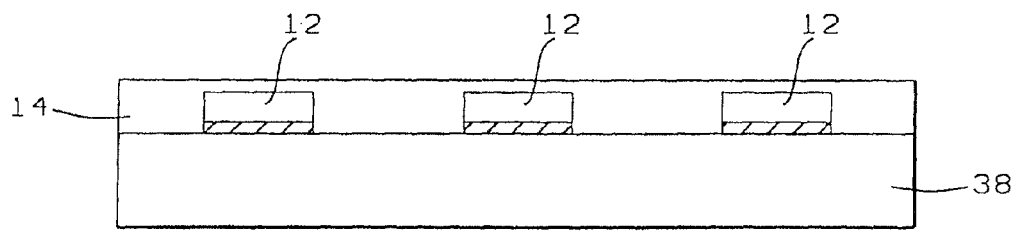
Figure 4C:
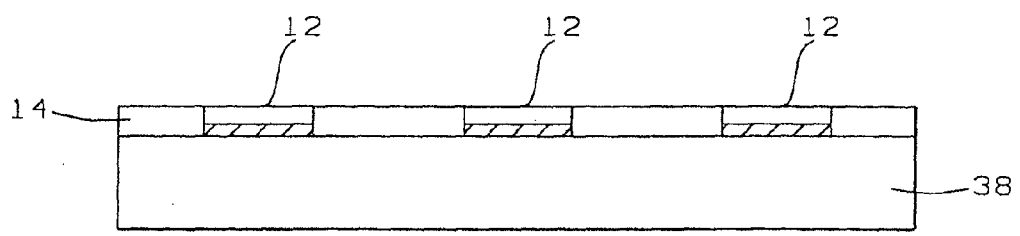
Figure 4D:
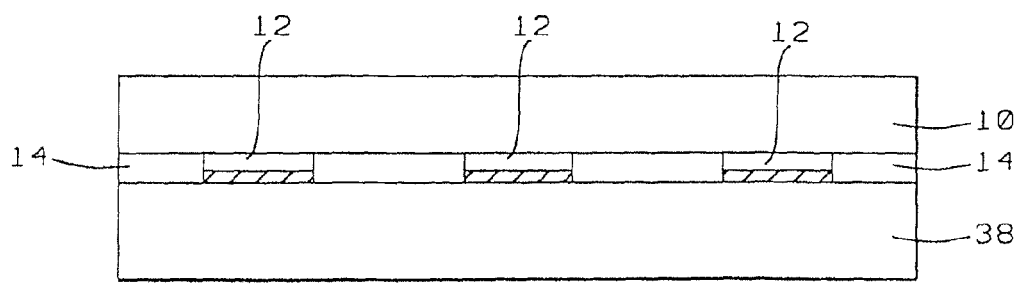
Figure 4E:
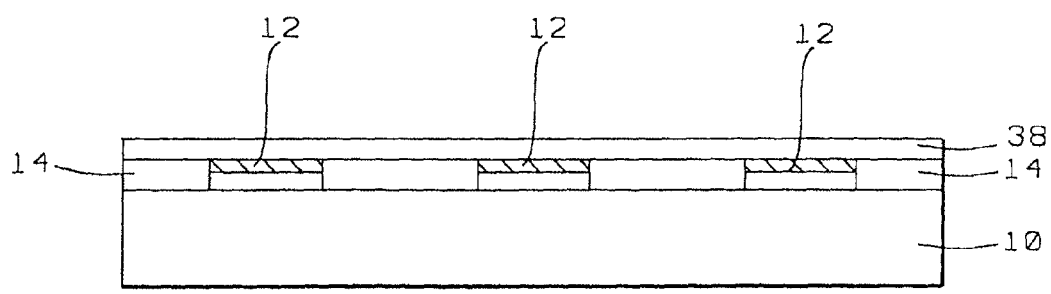
Figure 4F:
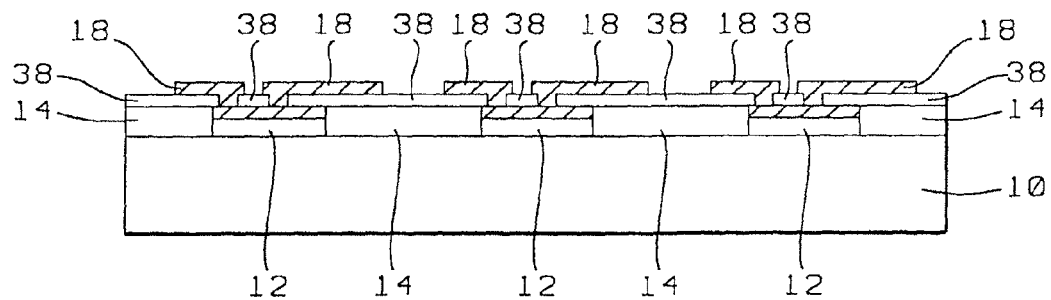
Figure 4G:
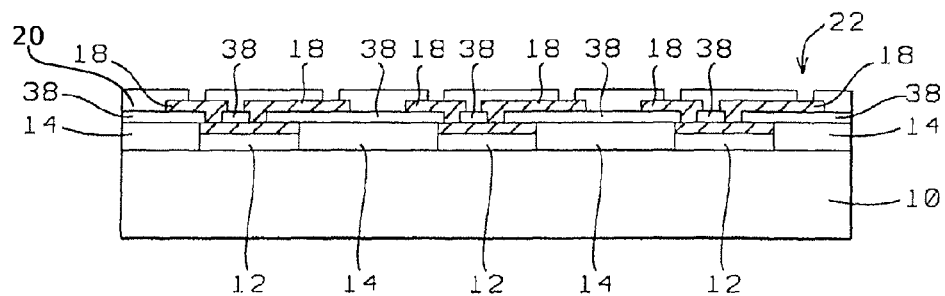
Figure 4H:
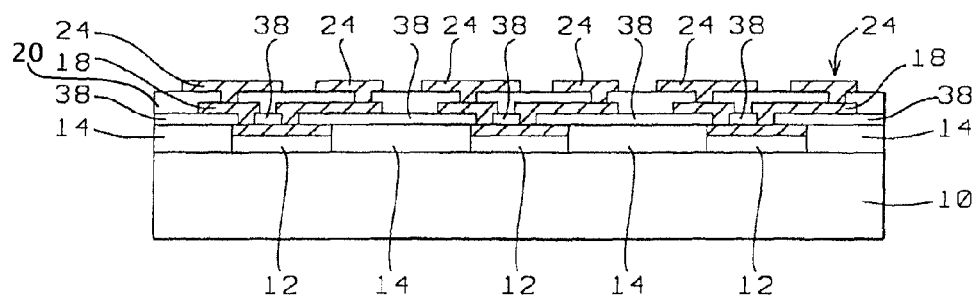
Figure 4I:
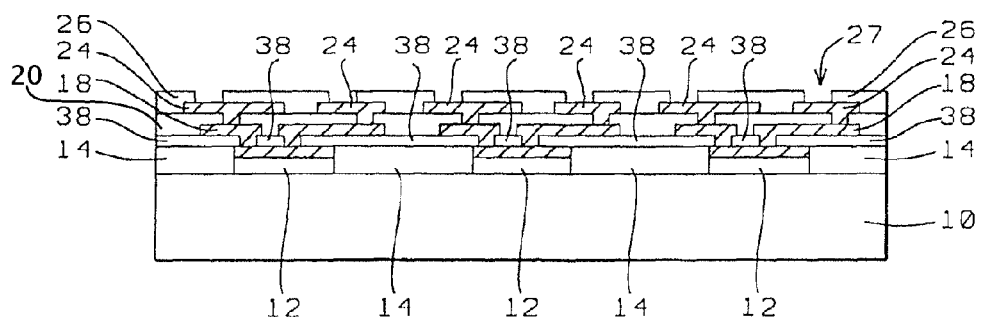
Figure 4J:
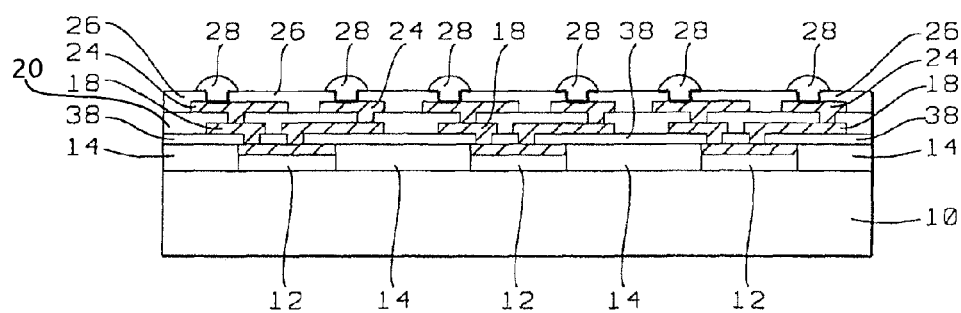
Figure 4K:
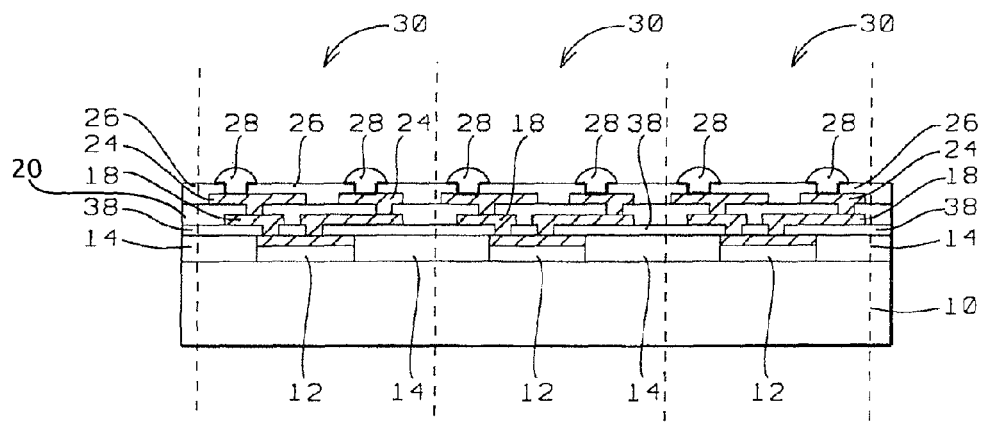
Figure 4L:
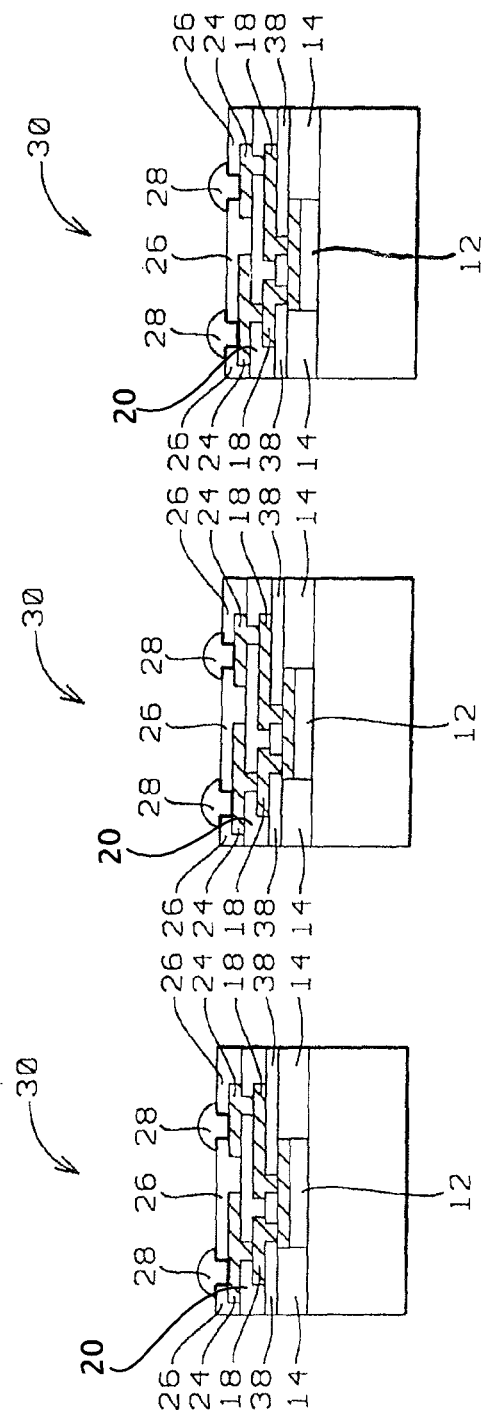
Figure 5A:
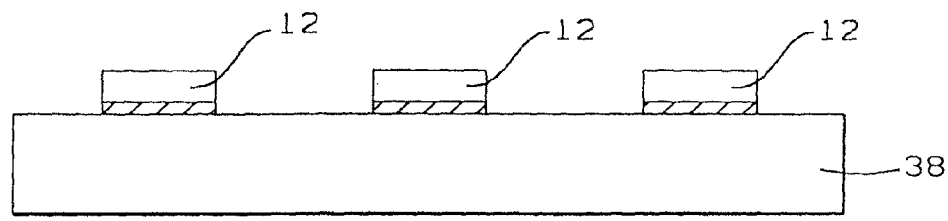
FIGS. 5a-5l show a fifth embodiment of the invention and the major fabrication steps.
Figure 5B:
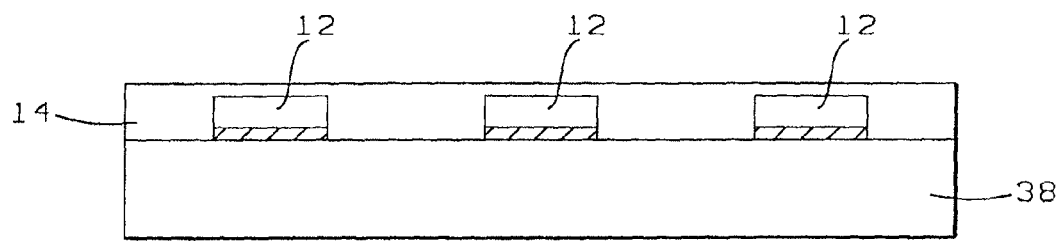
Figure 5C:
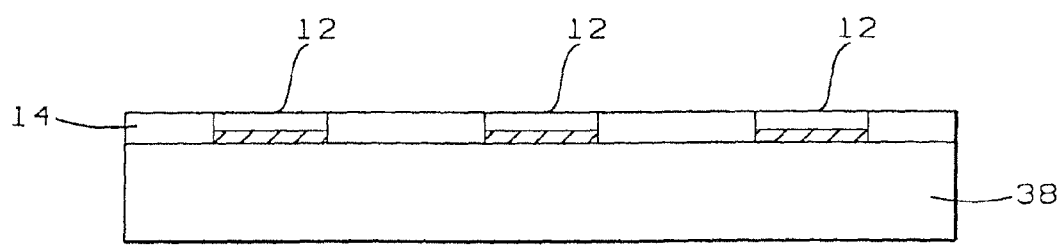
Figure 5D:
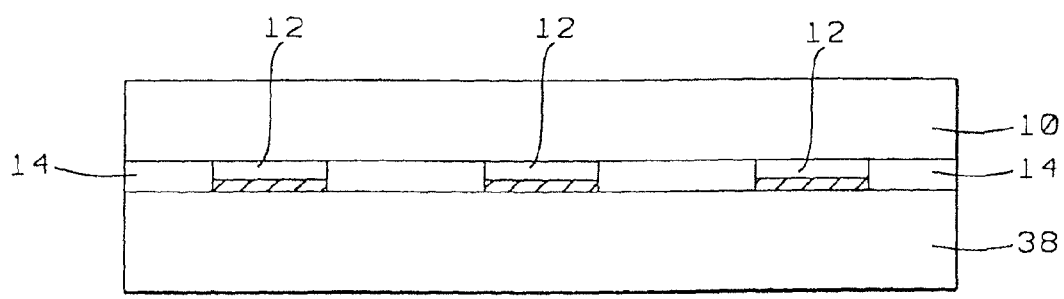
Figure 5E:
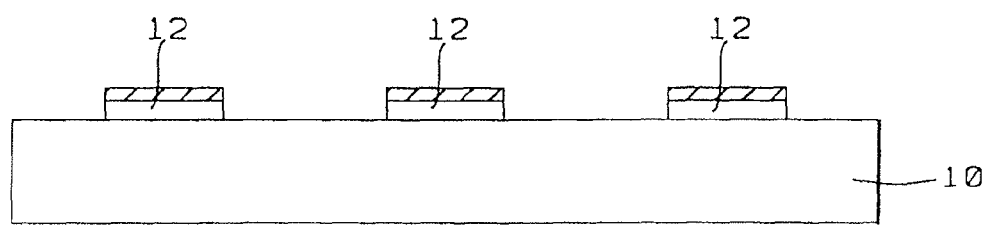
Figure 5F:
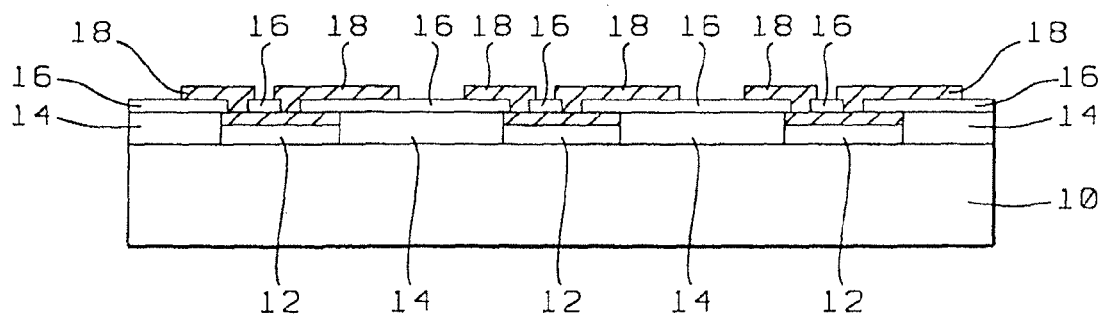
Figure 5G:
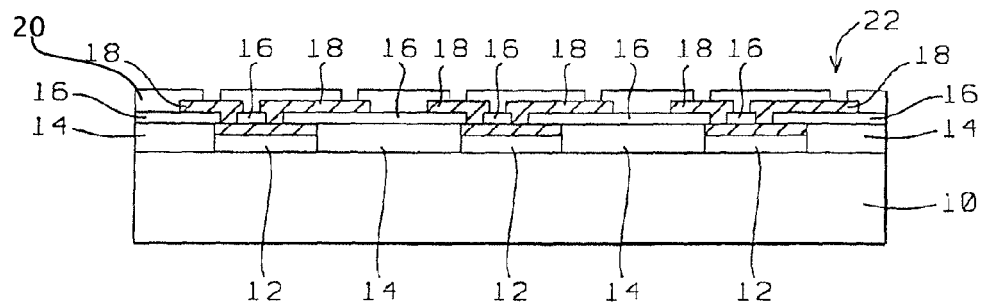
Figure 5H:
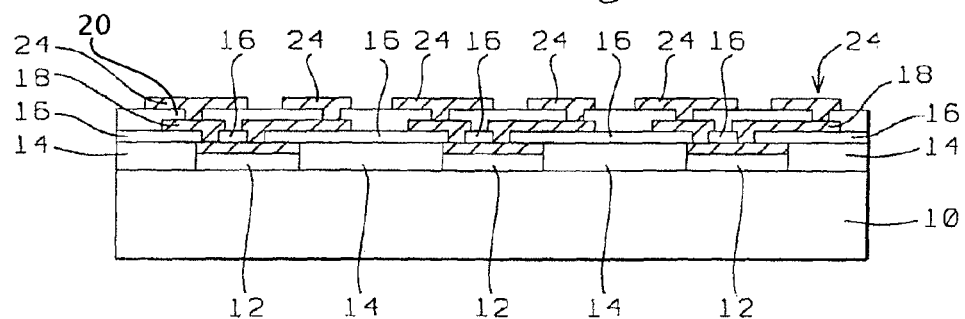
Figure 5I:
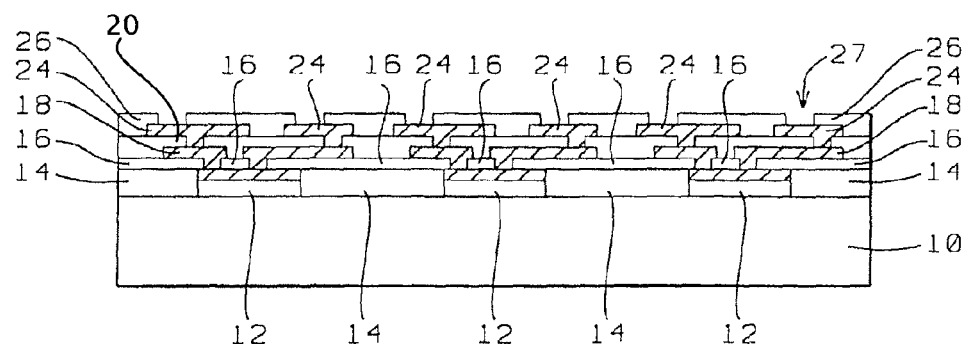
Figure 5J:
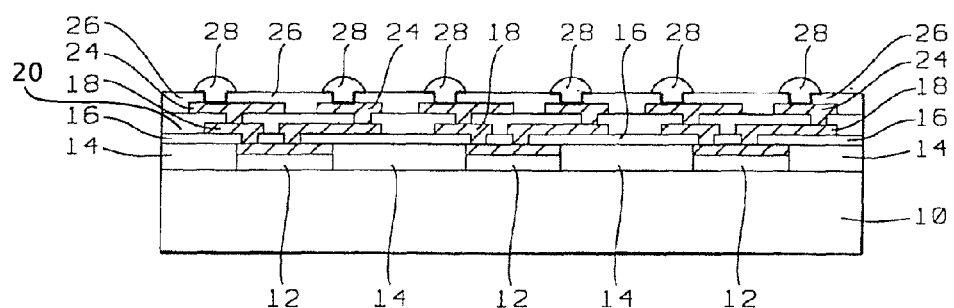
Figure 5K:
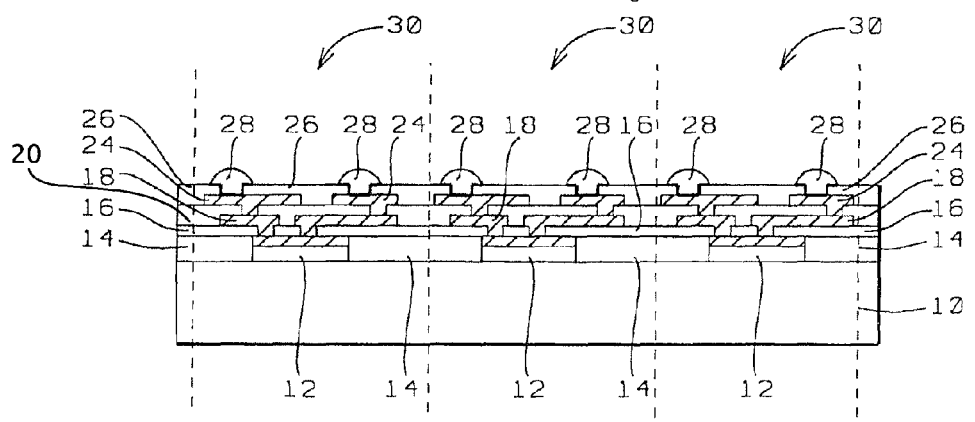
Figure 5L:
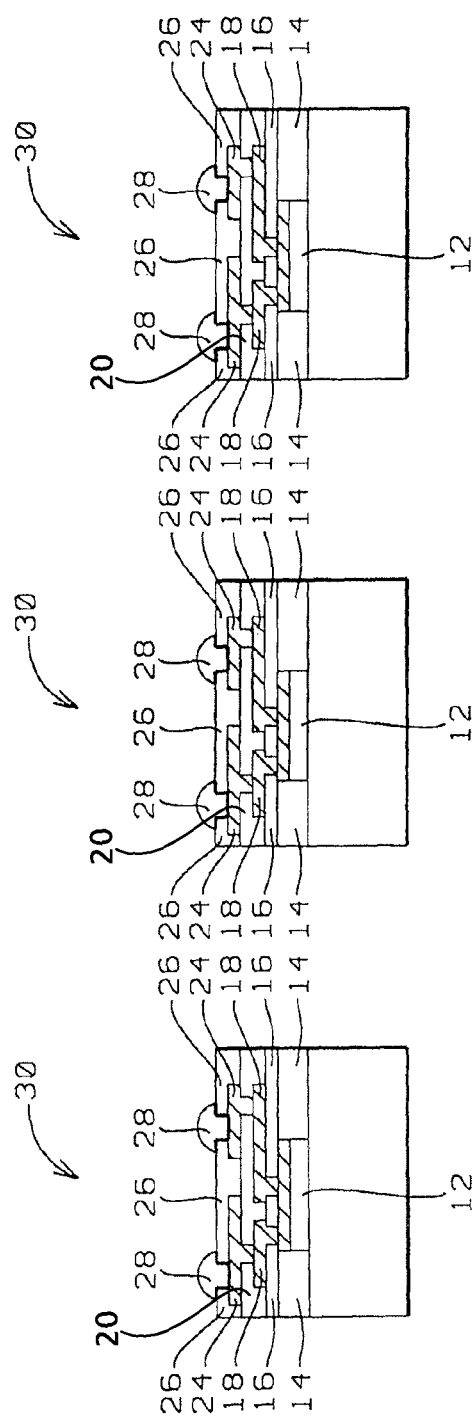

At this stage the panel is segmented. If the product is a single chip package, it is segmented into individual single chip modules 30, as shown in FIGS. 1i and 1j. If the product application is a multi-chip package, it would include interconnections (not shown) between the dies, and segmenting would be performed so that the interconnected dies were not segmented from one another. In the case of multi-chip packages, each chip within the multi-chip package can be the same type (e.g., memory, logic, etc.) or they may be of different types.

The second embodiment of the present invention shown in FIGS. 2a-2j also utilizes thin film polymer material for the insulating layers of the interconnect structure. The major fabrication steps are the same as the first embodiment shown in FIG. 1 with the exception that the glass substrate 32 used has cavities 34 to house the semiconductor dies, and that allow the semiconductor dies 12 to have a common planar surface for the application of the first dielectric layer 16. The cavities are formed by etching to a depth of about the thickness of the die, which is typically between about 30 and 750 um. Openings 27 are provided in dielectric layer 26.

The third embodiment of the present invention shown in FIGS. 3a-3j utilizes a glass-metal composite as the substrate 36. The glass layer is etched with cavities, using the underlying metal as an etch stop, that allow the semiconductor dies 12 to be bonded and to have a common planar surface for the application of the first dielectric layer 16. Alternately, holes may be punched in the glass sheet and the sheet laminated to the metal substrate. In addition the thermal path from the chip is improved by bonding to the metal substrate which acts as a thermal spreader. The thin film interconnect structure is the same as in the previous embodiments.

The fourth embodiment of the present invention as shown in FIGS. 4a-4l utilizes a glass substrate with the semiconductor dies mounted with the active surface on the glass substrate 38, or face down. A polymer or epoxy is used to fill the gap between dies and may cover dies also. The polymer or epoxy is used for planarization purposes. The surface is then ground to the desired thickness. CMP (Chemical Mechanical Planarization) may be used in the grinding. The first glass is used for the leveling of the active surface of the semiconductor dies. A second glass substrate 10 is then bonded to the back side of the semiconductor dies 12. The first glass substrate 38 is thinned by backside grinding to a thickness of 2 µm to 150 µm depending on the electrical design of the interconnect. Vias are etched in the thin glass substrate layer 38 to contact the semiconductor dies. The thin film interconnect layers are then formed as in the previous embodiments.

The fifth embodiment of the present invention shown in FIGS. 5a-5l utilizes a glass substrate 38 with the semiconductor dies mounted face down on the surface. A coating of a polymer or epoxy is deposited and the surface including the back of the semiconductor dies is ground to the desired thickness. Leveling of the surface is important for the follow-on thin film process. A second glass substrate is bonded to the back of the thinned semiconductor dies and the first glass substrate is removed. The thin film process is then completed as described above.

In each of the above embodiments, the interconnect metal may be used to form interconnections between one or more points of electrical contact on each of the semiconductor dies.

The present invention as described in the five embodiments provides wiring structures and methods to obtain them, that have the ability of greater fan-out from the semiconductor dies, with wiring structures that are far superior to the post passivation process described earlier and/or wafer level packages. The structures described above also have the ability to provide for a variety of passive components, e.g., capacitors, inductors, etc., internal to the wiring structure. These structures may be used in single chip fan-out packages or as interconnections between chips or multi-chip packages. Another advantage of the present invention is the ability to utilize present manufacturing equipment such as used in the manufacture of glass LCD panels.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A chip package comprising:
    an etchable glass substrate, wherein a first opening in said etchable glass substrate passes through said etchable glass substrate;
    a semiconductor chip coupled to the etchable glass substrate;
    a conductive structure comprising a first portion disposed within said first opening and a second portion coupled to the etchable glass substrate, wherein said first portion is coupled to said semiconductor chip, wherein said conductive structure comprises a passive device; and
    a dielectric layer over said etchable glass substrate and over said conductive structure, wherein a second opening in said dielectric layer exposes a contact point of said conductive structure.

2. The chip package of claim 1, wherein said passive device comprises an inductor.

3. The chip package of claim 1, wherein said passive device comprises a capacitor.

4. The chip package of claim 1, wherein said passive device comprises a resistor.

5. The chip package of claim 1, wherein said first opening is aligned with said semiconductor chip.

6. The chip package of claim 1, wherein said semiconductor chip is at a bottom side of said etchable glass substrate.

7. The chip package of claim 1 further comprises a conductive interconnect over said etchable glass substrate, wherein said conductive interconnect is coupled to said semiconductor chip.

8. The chip package of claim 7, wherein said conductive interconnect comprises a gold interconnect.

9. The chip package of claim 7, wherein said conductive interconnect comprises a solder interconnect.

10. The chip package of claim 1, wherein said etchable glass substrate has a width greater than that of said semiconductor chip.

11. The chip package of claim 1, wherein said dielectric layer comprises a polymer layer.

12. The chip package of claim 1, wherein said semiconductor chip is coupled with said etchable glass substrate.

13. The chip package of claim 1, wherein said semiconductor chip joins said conductive structure.

14. The chip package of claim 1, wherein said conductive structure comprises electroplated copper.

* * * * *